United States Patent
Yun et al.

(10) Patent No.: US 10,108,563 B2
(45) Date of Patent: Oct. 23, 2018

(54) MEMORY SYSTEM INCLUDING ON-DIE TERMINATION AND METHOD OF CONTROLLING ON-DIE TERMINATION THEREOF

(71) Applicant: SAMSUNG ELECTRONICS CO., LTD., Suwon-si, Gyeonggi-Do (KR)

(72) Inventors: Changho Yun, Seongnam-si (KR); Sung-Joon Kim, Hwaseong-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/659,182

(22) Filed: Jul. 25, 2017

(65) Prior Publication Data
US 2018/0039588 A1    Feb. 8, 2018

(30) Foreign Application Priority Data
Aug. 4, 2016    (KR) .................. 10-2016-0099601

(51) Int. Cl.
*G11C 7/00*     (2006.01)
*G06F 13/16*    (2006.01)
*G11C 11/406*   (2006.01)

(52) U.S. Cl.
CPC ........ *G06F 13/1689* (2013.01); *G11C 11/406* (2013.01)

(58) Field of Classification Search
CPC ................... G11C 11/406; G11C 11/40603
See application file for complete search history.

(56) References Cited

U.S. PATENT DOCUMENTS

| | | | |
|---|---|---|---|
| 7,514,955 B2 | 4/2009 | Kim | |
| 9,330,749 B1 | 5/2016 | Choksey et al. | |
| 2007/0002988 A1* | 1/2007 | Kim | G11C 7/1051 375/354 |
| 2008/0191734 A1* | 8/2008 | Yang | H03K 19/0005 326/30 |
| 2014/0244922 A1 | 8/2014 | Bains et al. | |
| 2014/0304445 A1 | 10/2014 | Gervasi | |

(Continued)

OTHER PUBLICATIONS

"Technical Note DDR3 Dynamic On-Die Termination", TN-41-04 DDR3 Dynamic On-Die Termination Introduction, Micron Technology, Inc., 2008, pp. 1-5.

*Primary Examiner* — Uyen B Tran
(74) *Attorney, Agent, or Firm* — F. Chau & Associates, LLC

(57) ABSTRACT

A memory system includes a first dual in-line memory module (DIMM), a second DIMM, and a controller. The first DIMM may include a first memory device including a first on-die termination (ODT) circuit connected to a data line. The second DIMM may include a second memory device including a second ODT circuit connected to the data line. The controller is connected to the first and second memory devices through the data line, generates first and second delay information, and determines whether to change an ODT duration of the first or second ODT circuit using the first and second delay information. The first delay information is indicative of a time taken for command/address or clock signals to reach the first memory device. The second delay information is indicative of a time taken for command/ address signal or clock signals to reach the second memory device.

15 Claims, 11 Drawing Sheets

(56) References Cited

U.S. PATENT DOCUMENTS

| | | |
|---|---|---|
| 2015/0019786 A1 | 1/2015 | Vaidyanath et al. |
| 2015/0227324 A1 | 8/2015 | Amer et al. |
| 2015/0331817 A1 | 11/2015 | Han et al. |
| 2016/0028395 A1 | 1/2016 | Bains et al. |
| 2016/0065212 A1 | 3/2016 | McCall et al. |
| 2017/0285941 A1* | 10/2017 | Nale .................... G11C 11/406 |

* cited by examiner

FIG. 4

| Name and Description | Abbr | Defined from | Define to | Definition for all DDR4 speed bins | unit |
|---|---|---|---|---|---|
| ODT Latency for changing from Rtt_PARK/Rtt_NOM to Rtt_WR | ODTLcnw | Registering external write command | Change Rtt strength from Rtt_PARK/Rtt_NOM to Rtt_WR | ODTLcnw = WL − 2 | tCK |
| ODT Latency for changing from Rtt_WR to Rtt_PARK/Rtt_NOM (BL=4) | ODTLcwn4 | Registering external write command | Change Rtt strength from Rtt_WR to Rtt_PARK/Rtt_NOM | ODTLcwn4 = 4 + ODTLcnw | tCK |
| ODT Latency for changing from Rtt_WR to Rtt_PARK/Rtt_NOM (BL=8) | ODTLcwn8 | Registering external write command | Change Rtt strength from Rtt_WR to Rtt_PARK/Rtt_NOM | ODTLcwn8 = 6 + ODTLcnw | tCK(avg) |
| Rtt change skew | tADC | ODTLcnw ODTLcwn | Rtt valid | tADC,min = 0.3 tADC,max = 0.7 | tCK(avg) |

_US 10,108,563 B2_

MEMORY SYSTEM INCLUDING ON-DIE TERMINATION AND METHOD OF CONTROLLING ON-DIE TERMINATION THEREOF

CROSS-REFERENCE TO RELATED APPLICATION

This U.S. non-provisional patent application claims priority under 35 U.S.C. § 119 to Korean Patent Application No. 10-2016-0099601, filed on Aug. 4, 2016, the disclosure of which is incorporated by reference herein in its entirety.

TECHNICAL FIELD

Exemplary embodiments of the inventive concept relate to semiconductor memory systems, and more particularly, to a memory system including an on-die termination and a method of controlling the on-die termination thereof.

DISCUSSION OF RELATED ART

A data signal transmitted along a transmission line of a semiconductor memory system may be reflected at a termination of the transmission line. The reflected data signal becomes noise that affects the original data signal and degrades quality of the original data signal. To prevent reflection of the data signal, a termination resistor is connected to the termination of the transmission line.

The termination resistor can reduce reflection of the data signal and prevent quality degradation of the data signal by matching an external impedance of the memory system with an internal impedance of the memory system. A termination circuit including the termination resistor may be used in a dynamic random access memory (DRAM) having a relatively fast operation speed. To prevent signal interference between DRAMs, an on-die termination (ODT) technology that connects a termination resistor to the inside of the DRAM may be used.

The memory system may include various forms of memory modules. A controller of the memory system controls an ODT operation between different kinds of memory modules. However, as an operation speed of the DRAM increases, a difference in data transmission delay between different kinds of memory modules may increase, thereby resulting in degradation of data transmission quality.

SUMMARY

According to an exemplary embodiment of the inventive concept, a memory system includes a first dual in-line memory module (DIMM), a second DIMM, and a controller. The first DIMM may include a first memory device including a first on-die termination (ODT) circuit connected to a data line. The second DIMM may include a second memory device including a second ODT circuit connected to the data line. The controller is connected to the first and second memory devices through the data line, generates first delay information and second delay information, and determines whether to change an ODT duration of the first ODT circuit or the second ODT circuit using the first and second delay information. The first and second memory devices may share the data line. The first delay information is indicative of a time taken for a first command/address signal or a first clock signal to reach the first memory device in the first DIMM. The second delay information is indicative of a time taken for a second command/address signal or a second clock signal to reach the second memory device in the second DIMM.

According to an exemplary embodiment of the inventive concept, in a method of controlling an on-die termination (ODT) of a memory system, first delay information of a first memory device included in a first dual in-line memory module (DIMM) of the memory system and second delay information of a second memory device included in a second DIMM of the memory system are collected at a controller included in the memory system, and a first ODT parameter of a first ODT of the first memory device and a second ODT parameter of a second ODT of the second memory device are calculated at the controller using the first and second delay information, respectively.

According to an exemplary embodiment of the inventive concept, a memory system includes a first memory module, a second memory module, and a controller. The first memory module includes a first plurality of memory devices sharing a first clock signal line. The second memory module includes a second plurality of memory devices sharing a second clock signal line. Each of the first plurality of memory devices and the second plurality of memory devices includes an on-die termination (ODT) circuit. The controller is configured to adjust an ODT parameter of at least one of the ODT circuits included in the first plurality of memory devices and the second plurality of memory devices using delay information. The delay information includes information on delays of clock signals transmitted along the first clock signal line and the second clock signal line to the first plurality of memory devices and the second plurality of memory devices, respectively.

BRIEF DESCRIPTION OF THE DRAWINGS

FIG. 4 is a table for describing an ODT parameter of the memory system of FIG. 1 according to an exemplary embodiment of the inventive concept.

DETAILED DESCRIPTION OF THE EMBODIMENTS

Figure 1:
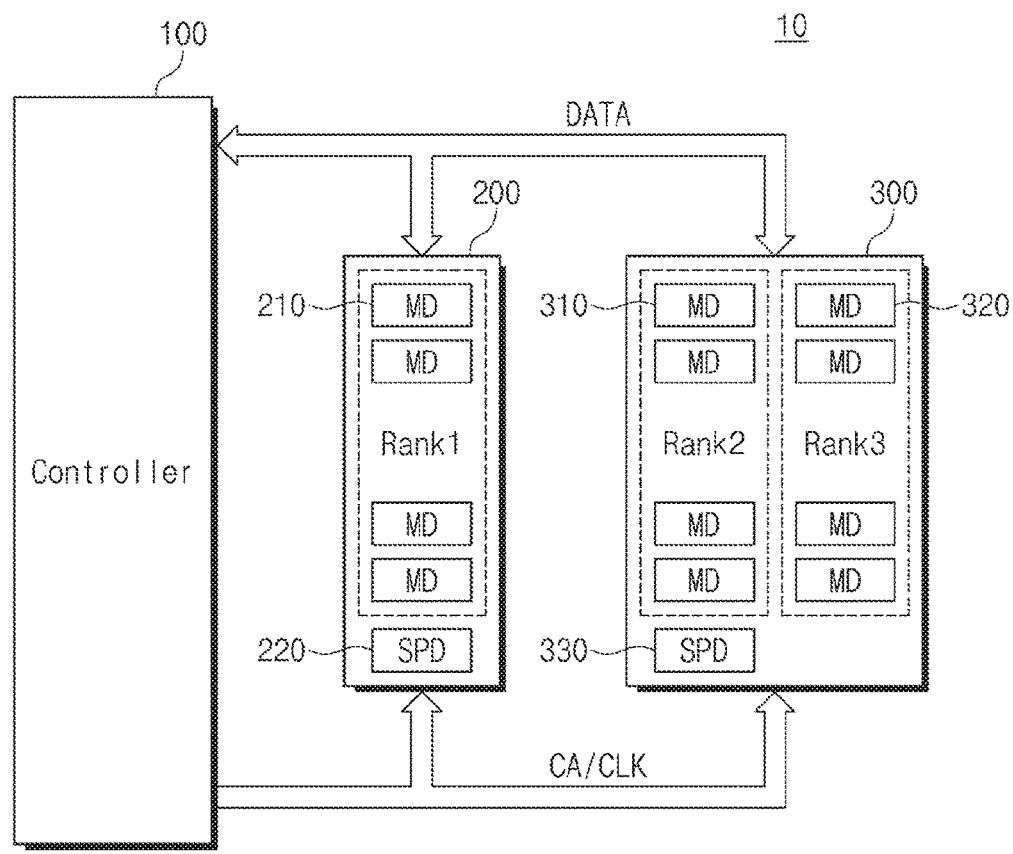
FIG. 1 is a block diagram illustrating a memory system according to an exemplary embodiment of the inventive concept.

Exemplary embodiments of the inventive concept will be described more fully hereinafter with reference to the accompanying drawings. Like reference numerals may refer to like elements throughout this application.

FIG. 1 is a block diagram illustrating a memory system according to an exemplary embodiment of the inventive concept. Referring to FIG. 1, a memory system 10 may include a controller 100, a first dual in-line memory module (DIMM) 200, and a second DIMM 300. The memory system 10 may be one of various electronic devices such as a home appliance, a computer, a notebook, a tablet, a wearable device, etc. For example, the memory system 10 may be a single system including the controller 100, the first DIMM 200, and the second DIMM 300. Alternatively, at least two of the controller 100, the first DIMM 200, and the second DIMM 300 may be implemented as separate devices.

The controller 100 exchanges data with the first and second DIMMs 200 and 300 through a data line DATA. The controller 100 provides a command, an address, and a clock signal to the first and second DIMMs 200 and 300 through a command address/clock (CA/CLK) line. For example, a connection configuration of the data line DATA will be described in detail with reference to FIG. 3 and connection configurations of the command address/clock (CA/CLK) line and the data line DATA will be described in detail with reference to FIGS. 6 and 7.

The controller 100 controls a data read operation, a data write operation, etc. of the first and second DIMMs 200 and 300 through the command address/clock (CA/CLK) line. In the data write operation of the first and second DIMMs 200 and 300, the controller 100 may control an on-die termination (ODT) operation or an ODT circuit of a plurality of memory devices (MD) included in the first and second DIMMs 200 and 300. The ODT operation may include a plurality of modes. Hereinafter, the ODT circuit and the ODT operation are referred to as an ODT. This is only for convenience of description and is not to limit the inventive concept.

The controller 100 may be a general-purpose processor, an application processor, or an electronic device. The controller 100 may also be a computing device (e.g., a personal computer, a peripheral device, a digital camera, a personal digital assistant (PDA), a portable media player (PMP), a smart phone, a tablet, a wearable device, etc.) that includes one or more processors.

The first and second DIMMs 200 and 300 are connected to the controller 100 through the data line DATA and the command address/clock (CA/CLK) line. The command address/clock (CA/CLK) line includes a command/address (C/A) line and a clock line that is separate from the command/address (C/A) line. The first and second DIMMs 200 and 300 may be connected to the controller 100 through one command address/clock (CA/CLK) line. Alternatively, the first and second DIMMs 200 and 300 may be connected to the controller 100 through first and second command address/clock (CA/CLK) lines, respectively, separated from each other. Exemplary embodiments of the inventive concept will be described below where the first and second DIMMs 200 and 300 are connected to the controller 100 through one command address/clock (CA/CLK) line, as an example. However, the inventive concept is not limited thereto.

Each of the first and second DIMMs 200 and 300 may include an unbuffered DIMM (UDIMM), a registered DIMM (RDIMM), a load reduced DIMM (LRDIMM), a nonvolatile DIMM (NVDIMM), etc. In the following description, it is assumed that the first and second DIMMs 200 and 300 have the UDIMM structure. Those are examples and do not limit the inventive concept. Although in FIG. 1, two DIMMs (e.g., the first and second DIMMs 200 and 300) are illustrated, this is also not to limit the inventive concept, and the memory system 10 may include more than two DIMMs or only one DIMM.

The first DIMM 200 may include a first rank (Rank1). A rank is a unit of a plurality of memory devices (MD) controlled by a chip select signal. As such, the first rank Rank1 may include a plurality of memory devices (MD). For convenience of description, a first memory device 210, among the plurality of memory devices (MD) included in the first rank Rank1, will be described as an example. The first DIMM 200 may further include a serial presence detect (SPD) 220 for storing length information of a command/address signal path or a clock signal path to the first memory device 210 within the first DIMM 200. Here, a line may include a signal path. For example, the whole clock line, included in the command address/clock (CA/CLK) line, may include the clock signal path to the first memory device 210.

The second DIMM 300 may include second and third ranks (Rank2, Rank3). Each of the second and third ranks (Rank2, Rank3) may include a plurality of memory devices (MD). For convenience of description, a second memory device 310, among the of memory devices (MD) included in the second rank Rank2, and a third memory device 320, among the plurality of memory devices (MD) included in the third rank Rank3, will be described as an example. However, this is not to limit the inventive concept. For example, the inventive concept may be applied to each of the plurality of memory devices (MD) included in the first through third ranks (Rank1 to Rank3).

The second DIMM 300 may further include a serial presence detect (SPD) 330 for storing length information of a command/address signal path or a clock signal path to the second memory device 310 within the second DIMM 300 and length information of a command/address signal path or a clock signal path to the third memory device 320 within the second DIMM 300.

In FIG. 1, each of the first through third ranks (Rank1 to Rank3) includes four memory devices (MD). However, this is illustrative and is not to limit the inventive concept. For example, each of the first through third ranks (Rank1 to Rank3) may include three or less memory devices (MD) or at least five memory devices (MD). Additionally, the first DIMM 200 may be configured to include at least two ranks and the second DIMM 300 may include one rank or at least three ranks.

The first through third memory devices 210, 310, and 320 may store data provided from the controller 100 or read out data to the controller 100 through a shared data line (e.g., the data line DATA). Each of the first through third memory devices 210, 310, and 320 receives a command or an address from the controller 100 to perform a read operation or a write operation. Each of the first through third memory devices 210, 310, and 320 may be a storage medium including a volatile memory or a nonvolatile memory.

Each of the first through third memory devices 210, 310, and 320 may include a volatile memory, such as a dynamic random access memory (DRAM), a static RAM (SRAM), a thyristor RAM (TRAM), a zero capacitor RAM (Z-RAM), or a twin transistor RAM (TTRAM).

Each of the first through third memory devices 210, 310, and 320 may include a nonvolatile memory, such as an electrically erasable programmable read-only memory (EEPROM), a flash memory, a magnetic RAM (MRAM), a spin-transfer torque MRAM, a conductive bridging RAM (CBRAM), a ferroelectric RAM (FeRAM), a phase change RAM (PRAM), a resistive RAM (RRAM), a nanotube RRAM, a polymer RAM (PoRAM), a nanotube floating gate memory (NFGM), a holographic memory, a molecular electronics memory device, or an insulator resistance change memory. One or more bits may be stored in a unit cell of the nonvolatile memory. For example, three bits may be stored in a unit cell of the nonvolatile memory.

For illustrative purposes, it is assumed here that each of the first through third memory devices 210, 310, and 320 is a DRAM memory device. However, the inventive concept is not limited thereto.

Each of the first through third memory devices 210, 310, and 320 may communicate with the controller 100. For example, each of the first through third memory devices 210, 310, and 320 may communicate with the controller 100 using at least one of various wired communication methods, such as a universal serial bus (USB), a small computer small interface (SCSI), a peripheral component interconnect express (PCIe), a mobile PCIe (M-PCIe), an advanced technology attachment (ATA), a parallel ATA (PATA), a serial ATA (SATA), a serial attached SCSI (SAS), an integrated drive electronics (IDE), a FireWire, a universal flash storage (UFS)), a transmission control protocol/internet protocol (TCP/IP), etc., or at least one of various wireless communication methods, such as long term evolution (LTE), worldwide interoperability for microwave access (WiMax), global system for mobile communication (GSM), code division multiple access (CDMA), high speed packet access (HSPA), Bluetooth, near field communication (NFC), WiFi, radio frequency identification (RFID), etc. However, these are examples and the inventive concept is not limited thereto.

The controller 100 generates delay information representing time taken for the command/address signal or the clock signal to reach the first memory device 210 in the first DIMM 200 or delay information representing time taken for the command/address signal or the clock signal to reach the second memory device 310 and the third memory device 320 in the second DIMM 300.

The controller 100 changes an ODT duration based on the generated delay information. The controller 100 may increase or reduce the ODT duration. The ODT duration is a time period during which at least one ODT, among ODTs of the first through third memory devices 210, 310, and 320, operates while the controller 100 writes data in one of the first through third memory devices 210, 310, and 320. Accordingly, the memory system 10 may prevent signal integrity (SI) characteristic degradation due to insufficient ODT duration for a change time to change a termination value of the ODT circuit. The change time may be referred to as a tADC parameter and this will be described below with reference to FIGS. 4 and 5.

The ODT duration may be based on a period of the clock signal. A method in which the controller 100 generates the delay information will be described in detail below with reference to FIGS. 9 and 10. For convenience of description, exemplary embodiments of the inventive concept will be described where the controller 100 increases the ODT duration. However, the inventive concept is not limited thereto.

Figure 2:
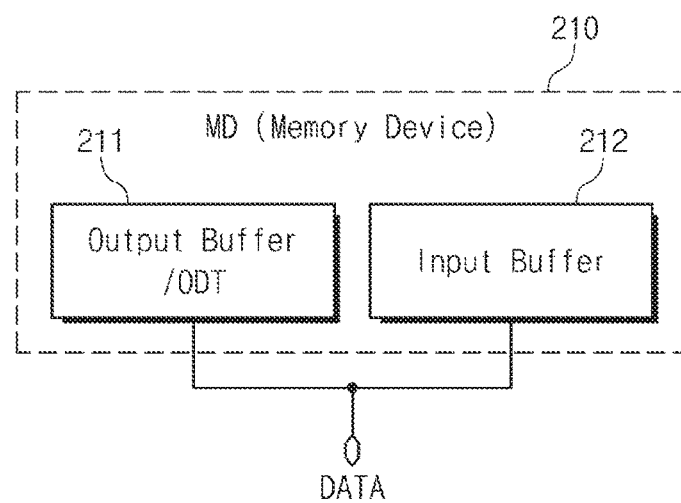
FIG. 2 is a block diagram illustrating a first memory device of FIG. 1 according to an exemplary embodiment of the inventive concept.

FIG. 2 is a block diagram illustrating a first memory device of FIG. 1 according to an exemplary embodiment of the inventive concept. Referring to FIG. 2, the first memory device 210 may include an output buffer/ODT 211 and an input buffer 212. The second and third memory devices 310 and 320 may have substantially the same configuration as the first memory device 210.

The output buffer/ODT 211 and the input buffer 212 share one data line DATA. When providing data to the controller 100, the output buffer/ODT 211 operates as an output driver. When writing data in the first memory device 210 through the input buffer 212, the output buffer/ODT 211 operates as an ODT.

A termination resistor may be connected to an end or termination of a transmission line to prevent a reflection of a signal and increase quality of the signal. The ODT is a kind of termination resistor and has an integrated form in the first memory device 210. When the output buffer/ODT 211 operates as the ODT, the output buffer/ODT 211 operates for impedance matching with the data line DATA.

In the case where the first memory device 210 is a double data rate fourth-generation synchronous dynamic random-access memory (DDR4 SDRAM), when the output buffer/ODT 211 operates as the ODT, the output buffer/ODT 211 may operate in three modes (e.g., Rtt_WR, Rtt_NOM, and Rtt_PARK), which will be described below. The three modes are classified by an operation state of a memory device including the ODT (e.g., the first memory device 210) and are defined by the Joint Electron Device Engineering Council (JEDEC).

Figure 3:
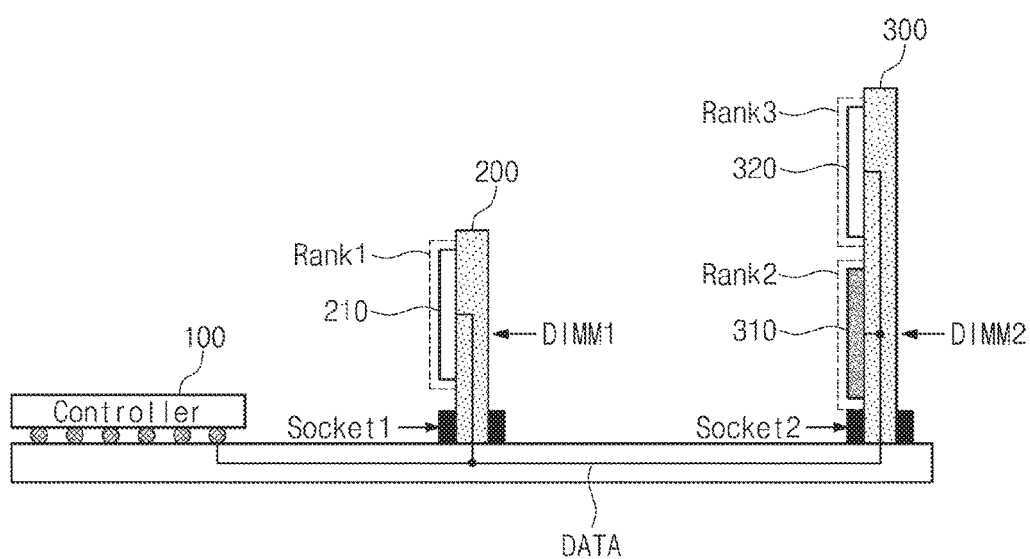
FIG. 3 is a side view of the memory system of FIG. 1 for describing an on-die termination (ODT) mode thereof according to an exemplary embodiment of the inventive concept.

FIG. 3 is a side view of the memory system of FIG. 1 for describing an ODT mode thereof according to an exemplary embodiment of the inventive concept. FIG. 3 will be described with reference to FIG. 1. Referring to FIG. 3, the first memory device 210 of the first rank Rank1 in the first DIMM 200, the second memory device 310 of the second rank Rank2 in the second DIMM 300, and the third memory device 320 of the third rank Rank3 in the second DIMM 300 are illustrated.

The first through third memory devices 210, 310, and 320 may be connected to the controller 100 through one shared data line DATA. The data line DATA may be a trace of a printed circuit board (PCB). The first and second DIMMs 200 and 300 are connected to the data line DATA through first and second sockets (Socket1, Socket2), respectively, and the PCB trace.

The first through third memory devices 210, 310, and 320 may include the ODT as illustrated in FIG. 2. As described above, an operation mode of ODT of each of the first through third memory devices 210, 310, and 320 may include the Rtt_WR mode, the Rtt_NOM mode, and the Rtt_PARK mode according to an operation state of each of the first through third memory devices 210, 310, and 320.

For illustrative purposes, it is assumed here that the controller 100 writes data in the first memory device 210. Referring to the JEDEC standard, the Rtt_WR mode is a mode in which the ODT of the first memory device 210, which performs a write operation, provides a termination resistor. The Rtt_NOM mode is a mode in which the ODT of at least one memory device of the second and third memory devices 310 and 320, which do not perform a write operation, provides a termination resistor. The Rtt_PARK is a mode in which the ODT of the first through third memory devices 210, 310, and 320 provides a termination resistor according to an initial value set by an ODT control signal. In addition, there may be a mode in which the ODT of each of the first through third memory devices 210, 310, and 320 does not operate. Here, the ODTs may provide the same or different termination values depending on the Rtt_WR mode, the RT_NOM mode, and the Rtt_PARK mode.

Depending on an operation timing of the ODT, an operation mode of each of the first through third memory devices 210, 310, and 320 may be divided into a synchronous mode and an asynchronous mode. This may be divided depending on whether a delay locked loop (DLL) in the first through third memory devices 210, 310, and 320 operates or not.

In addition, the first through third memory devices 210, 310, and 320 may support a dynamic ODT function. In this case, the controller 100 may control each of ODTs of the first through third memory devices 210, 310, and 320 according to a set of rules. The dynamic ODT function is a function to increase signal integrity (SI) of the first through third memory devices 210, 310, and 320 that share one data line DATA. When the first memory device 210 performs a write operation, a data signal transmitted from the controller 100 may be transmitted to the second and third memory devices 310 and 320 through the shared data line DATA. In this case, an SI characteristic of the data signal transmitted to the first memory device 210 may be degraded by a reflected wave that occurs at the second and third memory devices 310 and 320. According to an exemplary embodiment of the inventive concept, the controller 100 using the dynamic ODT function controls each of ODTs of the second and third memory devices 310 and 320 so that a reflected wave that occurs at the second and third memory devices 310 and 320 may be removed.

An ODT operation rule of the first through third memory devices 210, 310, and 320 according to the dynamic ODT function may vary depending on a manufacturer and a user of the memory system. When writing data in the first memory device 210, the ODT of the first memory device 210 may operate in the Rtt_WR mode and ODTs of the second and third memory devices 310 and 320 may operate in the Rtt_NOM mode. When the first memory device 210 performs a data write operation, it is assumed that each of the ODTs of the first through third memory devices 210, 310, and 320 operates according to the rules described above. However, this is only illustrative and is not to limit the inventive concept.

FIG. 4 is a table for describing an ODT parameter of the memory system of FIG. 1 according to an exemplary embodiment of the inventive concept. Referring to FIG. 4, a definition of ODT parameters associated with the ODT is described. Here, the first memory device 210 will be described as an example. The below description may also be applied to, for example, the second and third memory devices 310 and 320 of FIG. 1. With respect to FIG. 4, tCK is a clock cycle or period of a clock signal (e.g., applied to the command address/clock (CA/CLK) line), and tCK(avg) is an average clock cycle (e.g., an average of tCK values).

ODTLcnw is a latency for an ODT mode of the first memory device 210 to be changed from the Rtt_PARK mode or the Rtt_NOM mode to the Rtt_WR mode in response to a write command. For example, ODTLcnw may be equal to a write latency WL less two clock cycles (2 tCK). Alternatively, ODTLcwn4 and ODTLcwn8 are latencies for the ODT mode of the first memory device 210 to be changed from the Rtt_WR mode to the Rtt_PARK mode or the Rtt_NOM mode in response to a write command. ODTLcwn4 and ODTLcwn8 are classified according to a burst length (BL) value.

tADC is a time taken for the ODT mode of the first memory device 210 to be changed, e.g., from one of the Rtt_WR mode, the Rtt_NOM, mode and the Rtt_PARK mode to another of the Rtt_WR mode, the Rtt_NOM mode, and the Rtt_PARK mode. tADC also refers to a time taken for a termination value of the ODT to be changed. tADC will be described below with reference to FIG. 5.

tADC is associated with an SI characteristic of the first memory device 210. The memory system 10 of FIG. 1 controls an ODT operation of the first through third memory devices 210, 310, and 320 to optimize the SI characteristic of a data write operation. However, in the case where a tADC,max characteristic is outside the standard value illustrated in FIG. 4 due to a physical delay inside the first and second DIMMs 200 and 300, the first through third memory devices 210, 310, and 320 may not provide a termination resistor within an ideal time. In this case, an unwanted reflected wave may occur and thus, an SI characteristic of the data signal may be degraded. According to an exemplary embodiment of the inventive concept, the controller 100 can calculate the tADC,max parameter of each of the first through third memory devices 210, 310, and 320. The controller 100 can also prevent SI characteristic degradation of the data signal by changing the ODT duration based on the calculated tADC,max parameter.

Figure 5:
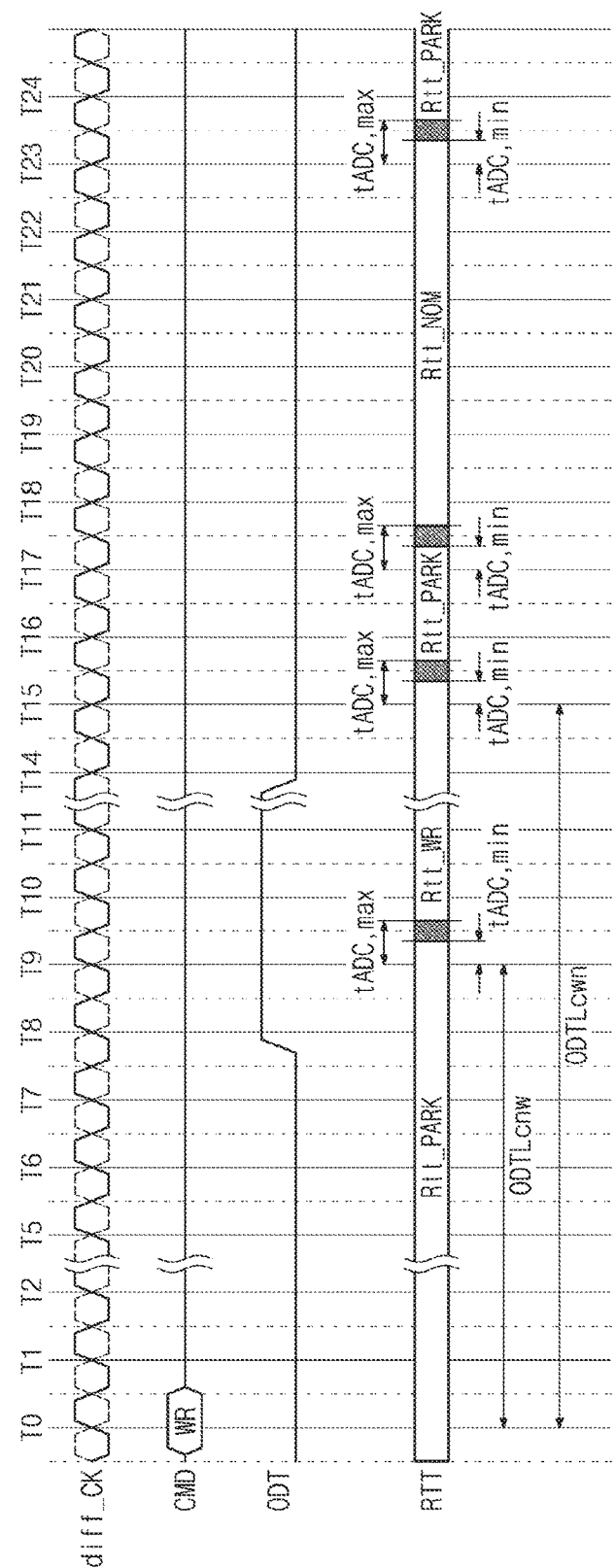
FIG. 5 is a timing diagram illustrating an ODT parameter of FIG. 4 according to an exemplary embodiment of the inventive concept.

FIG. 5 is a timing diagram illustrating an ODT parameter of FIG. 4 according to an exemplary embodiment of the inventive concept. FIG. 5 will be described using the first memory device 210 of FIG. 1 as an example. This description may be similarly applied to the second and third memory devices 310 and 320. Referring to FIG. 5, a process in which the first memory device 210 receives a write command to change the ODT mode is illustrated. The clock signal provided by the controller 100 of FIG. 1 may be a differential clock signal diff_CK.

At T0, the first memory device 210 receives a write command WR from the controller 100 of FIG. 1. The controller 100 provides an ODT control signal ODT to the first memory device 210 after a specific clock period. In T0 to T8, since the first memory device 210 is in a state where it has not received data in accordance with the write command WR, the ODT of the first memory device 210 operates in the Rtt_PARK mode. At T8, the first memory device 210 receives the ODT control signal ODT. After one clock period, the first memory device 210 performs a change operation of the ODT mode.

From T9 to T10, the first memory device 210 changes the ODT mode from the Rtt_PARK mode to the Rtt_WR mode. As described with reference to FIG. 4, ODT_cnw is the time from T0 when an external write command (e.g., the write command WR) is received to T9 when the ODT mode is changed. A tADC,min characteristic is a time from T9 to a time point when the ODT mode begins to be actually changed. The tADC,max characteristic is a time from T9 to a time point when the change of the ODT mode from the Rtt_PARK mode to the Rtt_WR mode is completed.

From T10 to T15, the first memory device 210 operates in the Rtt_WR mode. The T10 to T15 period may be the ODT duration. However, this is only illustrative and the ODT duration may be changed by a memory system designer or a memory system user. The first memory device 210 may receive data to perform the write command during the ODT duration. Thus, if the ODT duration is insufficient to cover the time while the data is received, an SI characteristic of the data signal may be degraded.

At T15, the ODT of the first memory device 210 changes the ODT mode from the Rtt_WR mode to the Rtt_PARK mode after the ODT duration. As described above, tADC, min is a time from T15 to a time point when the ODT mode begins to be actually changed to the Rtt_PARK mode. tADC,max is a time from T15 to a time point when the change of the ODT mode from the Rtt_WR mode to the Rtt_PARK mode is completed. From T15 to T16, the ODT of the first memory device 210 completes a change operation of the ODT mode to the Rtt_PARK mode (after tADC,max has elapsed).

From T16 to T24, the ODT of the first memory device 210 sequentially operates in the Rtt_PARK mode, the Rtt_NOM mode, and the Rtt_PARK mode. The ODT parameters ODT_cnw, tADC,min, the tADC,max, etc. with respect to this section are similar to as described above.

In an ODT operation of the first memory device 210, reasons for the occurrence of ODT parameters such as tADC,min, tADC,max, etc. are numerous. For example, they may occur due to the first memory device 210 itself, e.g., a propagation delay time due to an element inside a chip, a variation of a propagation delay time due to power noise such as simultaneous switching noise, a parasitic component that exists on a transmission path inside a chip, etc.

As illustrated in FIG. 2, a plurality of memory devices may use one shared channel. Accordingly, an ODT parameter, such as tADC,min, tADC,max, etc., may occur due to a length difference of a transmission path of a command/address signal or a clock signal in the DIMM, or due to a difference of a signal transmission time because of the length difference. This will be described below with reference to FIGS. 6 and 7.

Figure 6:
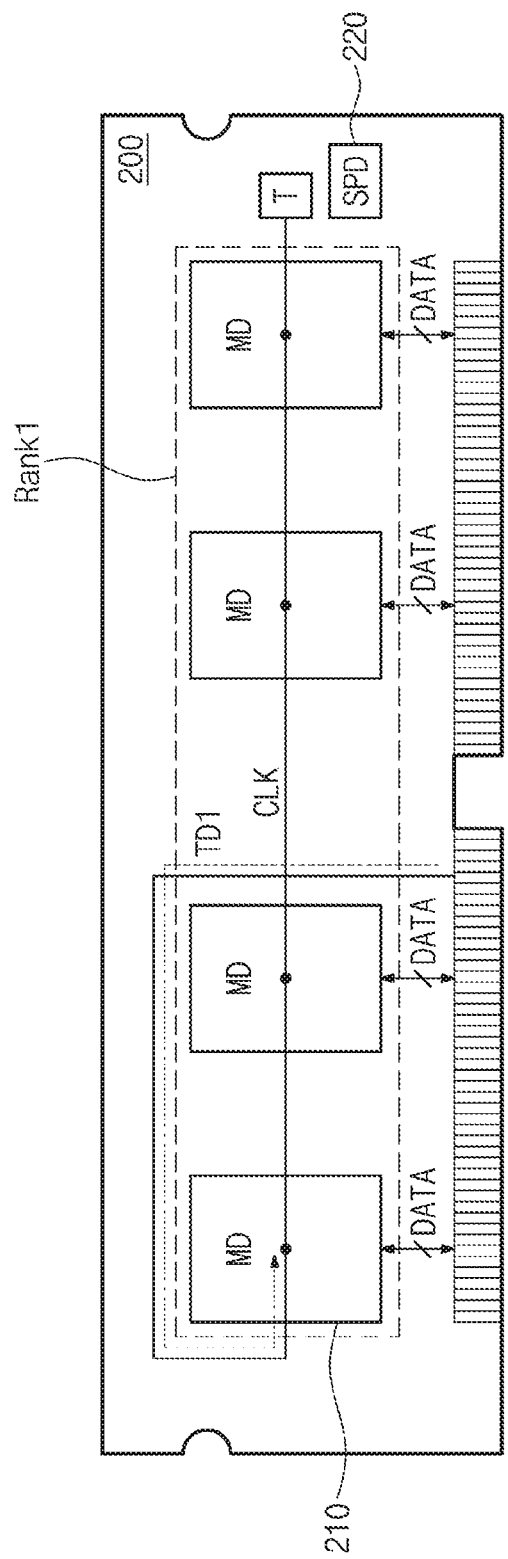
FIG. 6 is a view illustrating a first dual in-line memory module (DIMM) of FIG. 1 according to an exemplary embodiment of the inventive concept.

FIG. 6 is a view illustrating a first DIMM of FIG. 1 according to an exemplary embodiment of the inventive concept. FIG. 6 will be described with reference to FIG. 1. Referring to FIG. 6, the first DIMM 200 may include the first rank (Rank1). The first rank (Rank1) may include four memory devices (MD). The first DIMM 200 may further include the serial presence detect (SPD) 220. The first DIMM 200 may have an unbuffered DIMM (UDIMM) structure.

With respect to a data signal, each of the four memory devices (MD) communicates with the controller 100 in a point-to-point method. Each of the four memory devices (MD) exchanges data with the controller 100 through a separate data line DATA. As illustrated in FIG. 2, each of the four memory devices (MD) may include an ODT for impedance matching with the data line DATA.

With respect to a clock signal, each of the four memory devices (MD) communicates with the controller 100 in a fly-by method. In other words, each of the four memory devices (MD) receives the clock signal through one shared clock signal line CLK. With respect to the clock signal line CLK, the first DIMM 200 may include an off-chip termination resistor T for impedance matching with the clock signal line CLK. Since the controller 100 sequentially provides the clock signal to the four memory devices (MD) according to the fly-by method, a simultaneous switching noise (SSN) inside the first DIMM 200 may be reduced. By using the fly-by method, the four memory devices (MD) operate by clock signals with different delay times.

The time taken for the clock signal to reach the first memory device 210 along the clock signal line CLK may be a first delay TD1. The first delay TD1 may be determined by a material of the first DIMM 200, a characteristic of a trace of the first DIMM 200, and a location of the first memory device 210. The SPD 220 may be configured to store length information of a command/address signal path or a clock signal path to the first memory device 210 within the first DIMM 200.

Figure 7:
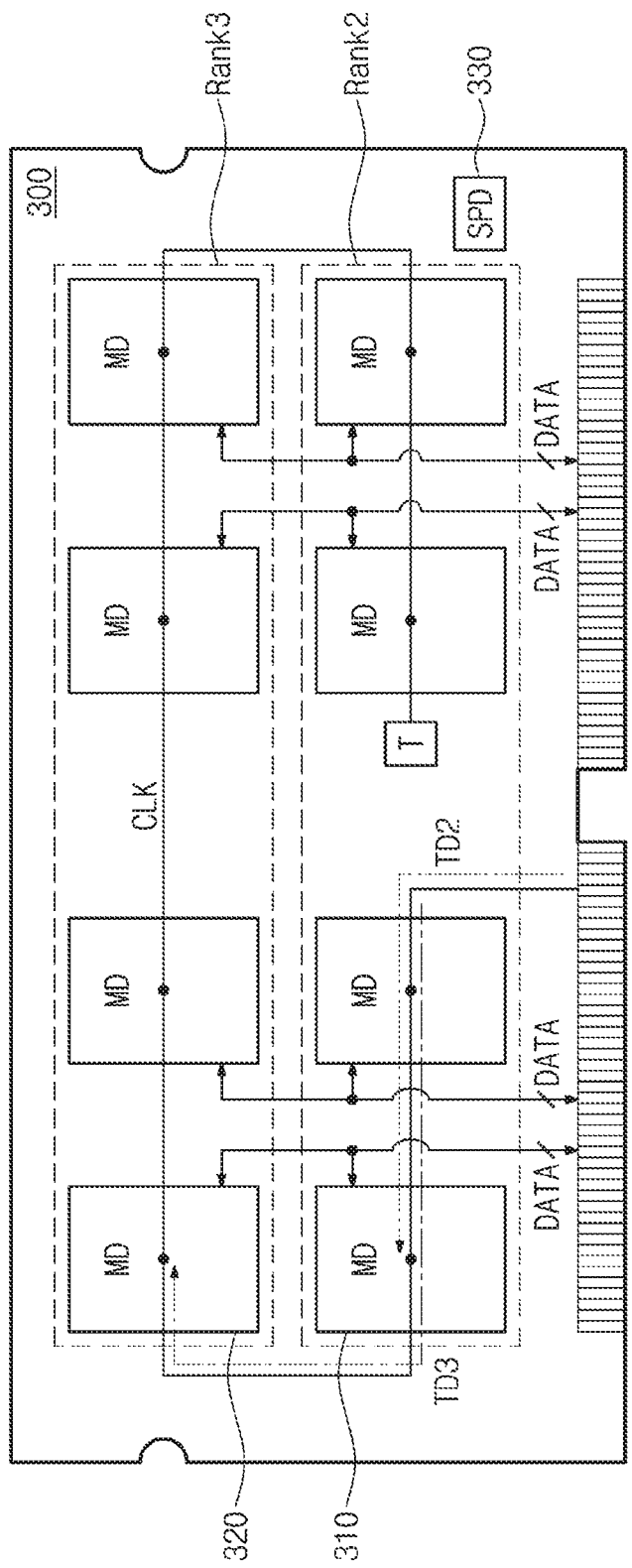
FIG. 7 is a view illustrating a second DIMM of FIG. 1 according to an exemplary embodiment of the inventive concept.

FIG. 7 is a view illustrating a second DIMM of FIG. 1 according to an exemplary embodiment of the inventive concept. Referring to FIG. 7, the second DIMM 300 may include the second and third ranks (Rank2, Rank3). Each of the second and third ranks (Rank2, Rank3) may include four memory devices (MD). The second DIMM 300 may further include the SPD 330. The second DIMM 300 may have an unbuffered DIMM (UDIMM) structure.

With respect to a data signal, each of the four memory devices (MD) of the second rank (Rank2) and each of the four memory devices (MD) of the third rank (Rank3) communicate with the controller 100 in a point-to-point method. Each of the four memory devices (MD) of the second rank (Rank2) and each of the four memory devices (MD) of the third rank (Rank3) exchange data with the controller 100 through a separate data line DATA. The four memory devices (MD) of the second rank (Rank2) are arranged in order and the four memory devices (MD) of the third rank (Rank3) are also arranged in order. Pairs of memory devices (MD) that are in the same position in their respective orders in the second and third ranks (Rank2, Rank3) are connected to each other through the data line DATA. For example, the second memory device 310, which is the first memory device of the second rank (Rank2), is connected to the third memory device 320, which is the first memory device of the third rank (Rank3). As illustrated in FIG. 2, each of the eight memory devices (MD) may include an ODT for impedance matching with the data line DATA.

With respect to a clock signal, each of the eight memory devices (MD) communicates with the controller 100 in a fly-by method. In other words, each of the eight memory devices (MD) receives the clock signal through one shared clock signal line CLK. With respect to the clock signal line CLK, the second DIMM 300 may include the off-chip termination resistor T for impedance matching with the clock signal line CLK. Similar to the first DIMM 200 of FIG. 6, the eight memory devices (MD) operate by clock signals with different delay times.

Here, a time taken for the clock signal to reach the second memory device 310 along the clock signal line CLK may be a second delay TD2. A time taken for the clock signal to reach the third memory device 320 along the clock signal line CLK may be a third delay TD3. Similar to the first delay TD1 of FIG. 6, the second and third delays TD2 and TD3 may be determined by a material of the second DIMM 300, a characteristic of a trace on the second DIMM 300, and a location of the second and third memory devices 310 and 320.

The SPD 330 is configured to store length information of a command/address signal path or a clock signal path to the second memory device 310 or the third memory device 320 within the second DIMM 300. In FIGS. 6 and 7, only the clock signal line CLK is illustrated. However, this is only illustrative and the inventive concept is not limited thereto. For example, the clock signal line CLK may be replaced with a command signal path that may affect ODT timing.

As described above, the ODT parameters, such as tADC, min, tADC,max, etc., may be affected by a single memory device's own operation characteristics. Since the ODT of each of the first through third memory devices 210, 310, and 320 operates in synchronization with the clock signal, the ODT parameters may be affected by the first through third delays (TD1 to TD3). When the operation characteristics of the first through third memory devices 210, 310, and 320 are substantially the same, tADC,min may be determined by the shortest delay among the first through third delays (TD1 to TD3). Since the memory system 10 of FIG. 1 controls an ODT operation based on the first through third delays (TD1 to TD3), SI characteristic degradation due to a margin shortage of the ODT duration may be prevented. For example, the ODT duration may be increased by a sufficient margin to account for a length of time of tADC,max (e.g., the time to complete an ODT operation mode change). This will be described further below.

Figure 8:
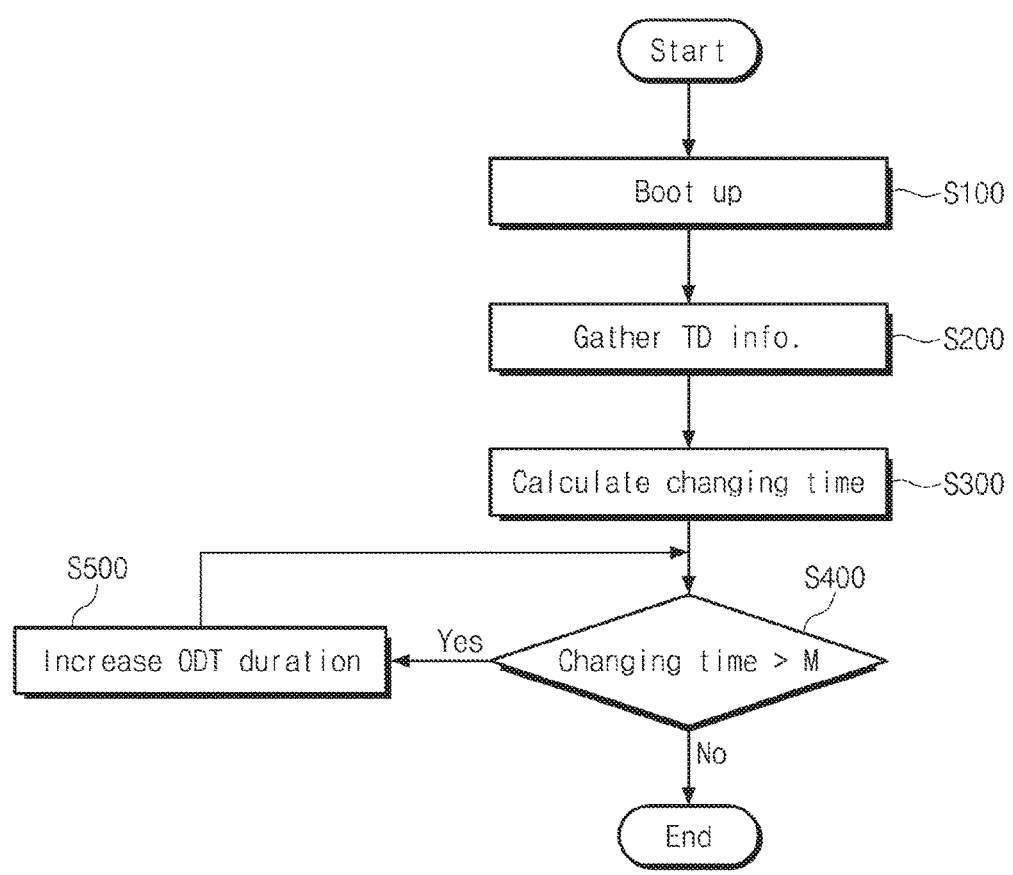
FIG. 8 is a flowchart illustrating an ODT control method of the memory system of FIG. 1 according to an exemplary embodiment of the inventive concept.

FIG. 8 is a flowchart illustrating an ODT control method of the memory system of FIG. 1 according to an exemplary embodiment of the inventive concept. FIG. 8 will be described with reference to FIGS. 1, 6, and 7. Referring to FIG. 8, the memory system 10 may collect delay information of the first and second DIMMs 200 and 300 to change the ODT duration.

In an operation S100, the memory system 10 is booted up. During the boot-up process, training with respect to the first and second DIMMs 200 and 300 may be performed by the controller 100. In exemplary embodiments of the inventive concept, the training may be performed in an operation S200, described below, after the boot-up of the operation S100.

In the operation S200, the controller 100 collects information of the first delay TD1 with respect to the first memory device 210 of the first DIMM 200 and information of the second and third delays TD2 and TD3 with respect to the second and third memory devices 310 and 320 of the second DIMM 300. The controller 100 may generate information of the first through third delays (TD1 to TD3) through the training and may collect the generated information. The controller 100 may also generate information of the first through third delays (TD1 to TD3) based on information stored in the SPDs 220 and 330 and collect the generated information.

In an operation S300, the controller 100 calculates an ODT operation parameter of each of the first through third memory devices 210, 310, and 320 based on the information of the first through third delays (TD1 to TD3). Here, the ODT operation parameter may be a changing time of an ODT termination value of each of the first through third memory devices 210, 310, and 320. For example, the changing time may include tADC,min and tADC,max. Hereinafter, it is assumed that the changing time is tADC,max.

In an operation S400, the controller 100 determines whether at least one of the tADC,max parameters of the first through third memory devices 210, 310, and 320 is greater than a reference value M. M may be a reference tADC,max value, as illustrated in FIG. 4. M may be changed by a designer or a user of the memory system. When at least one of the tADC,max parameters is greater than the reference value M (Yes), the controller 100 performs an operation S500. When all of the tADC,max parameters are less than or equal to the reference value M (No), the procedure is ended and the controller 100 maintains an existing ODT duration.

In the operation S500, the controller 100 increases the ODT duration of at least one ODT of the first through third memory devices 210, 310, and 320. The controller 100 may increase the ODT duration by an absolute value regardless of a period of the clock signal. Alternatively, the controller 100 may increase the ODT duration by adding the existing ODT duration to the product of N and the period of the clock signal. Here, N is an integer which is not 0. Subsequently, the controller 100 performs the operation S400 again.

After the procedure described above is complete, the controller 100 controls the ODTs based on the ODT duration determined through the operations S100 to S500.

Figure 9:
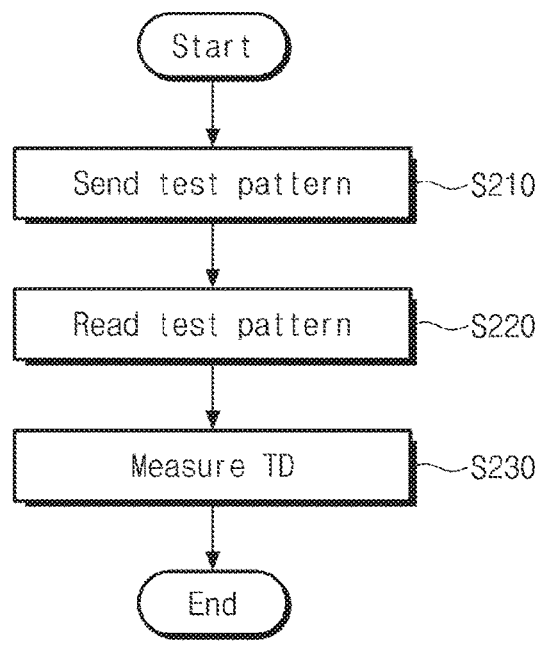
FIGS. 9 and 10 are flowcharts illustrating an operation of FIG. 8 according to exemplary embodiments of the inventive concept.
Figure 10:
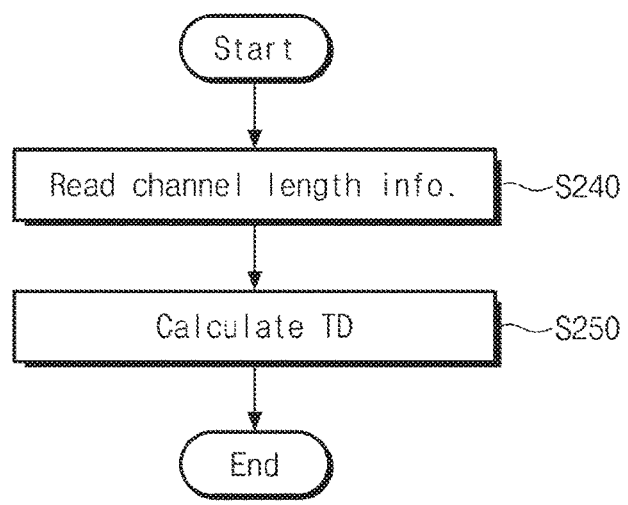

FIGS. 9 and 10 are flowcharts illustrating the operation S200 of FIG. 8 according to exemplary embodiments of the inventive concept. FIGS. 9 and 10 will be described with reference to FIG. 1.

Referring to FIG. 9, the controller 100 may perform I/O training with respect to the first through third memory devices 210, 310, and 320 and use this to collect information of the first through third delays (TD1 to TD3).

In an operation S210, the controller 100 transmits a test pattern to each of the first through third memory devices 210, 310, and 320. In an operation S220, the controller 100 receives and reads a test pattern returned from each of the first through third memory devices 210, 310, and 320. Here, operations S210 and S220 may correspond to the I/O training. In an operation S230, the controller 100 measures and generates the first through third delays (TD1 to TD3) based on the received test patterns.

The test pattern may include write and read commands for data. Alternatively, the test pattern may include an ODT control signal or a command that changes an ODT operation mode. However, this is only illustrative and the inventive concept is not limited thereto. For example, the test pattern may be any pattern that can calculate an ODT parameter, such as tADC,max, through a test result. Since the first through third memory devices 210, 310, and 320 share one data line (e.g., the data line DATA of FIG. 1), the I/O training may sequentially proceed with respect to the first through third memory devices 210, 310, and 320.

Referring to FIG. 10, the controller 100 may read path (or channel length) information of a command/address signal or a clock signal from the SPDs 220 and 330 included in the first and second DIMMs 200 and 300, respectively, and may calculate information of the first through third delays (TD1 to TD3) based on the path information.

In an operation S240, the controller 100 may read the path information (e.g., length information) of a command/address signal or a clock signal from the SPDs 220 and 330 included in the first and second DIMMs 200 and 300, respectively. As described above, the SPD 220 may include length information of a path of the command/address signal or the clock signal to the first memory device 210 within the first DIMM 200. The SPD 330 may include length information of a path of the command/address signal or the clock signal to the second memory device 310 or the third memory device 320 within the second DIMM 300. For example, the command/address signal may include an ODT control signal.

Since a delay of the clock signal is proportional to a length of the clock signal path, the controller 100 may calculate information of the first through third delays (TD1 to TD3) through the length information of the clock signal path. When the command/address signal path is connected to a plurality of memory devices (MD) using a fly-by method similar to that used by the clock signal path (as described with reference to FIGS. 6 and 7), a length of the command/address signal path may be proportional to the length of the clock signal path. Thus, the controller 100 may calculate the length of the clock signal path through the length of the command/address signal path.

The SPDs 220 and 330 may be configured to store the aforementioned length information when the memory system is manufactured. The SPDs 220 and 330 may be configured to further store delay information based on an operation frequency. Additionally, the SPDs 220 and 330 may be configured to further store information about a structure and a characteristic of a PCB substrate that constitutes the first and second DIMMs 200 and 300.

In an operation S250, the controller 100 may generate information of the first through third delays (TD1 to TD3) based on the information read in the operation S240. The controller 100 may calculate the information of the first through third delays (TD1 to TD3) by a mathematical formula 1.

$$TD = \sqrt{L \times C}$$ [mathematical formula 1]

Here, L is an inductance of a transmission line (e.g., the clock signal path) and C is a capacitance of the transmission line. The mathematical formula 1 is only an example in which the controller 100 calculates the information of the first through third delays (TD1 to TD3) based on the information stored in the SPDs 220 and 330, and the inventive concept is not limited thereto. For example, the controller 100 can generate the first through third delays (TD1 to TD3) using not only the mathematical formula 1 but also any other mathematical formula to take into consideration various conditions. In this case, the controller 100 may read necessary information from the SPDs 220 and 330.

Figure 11:
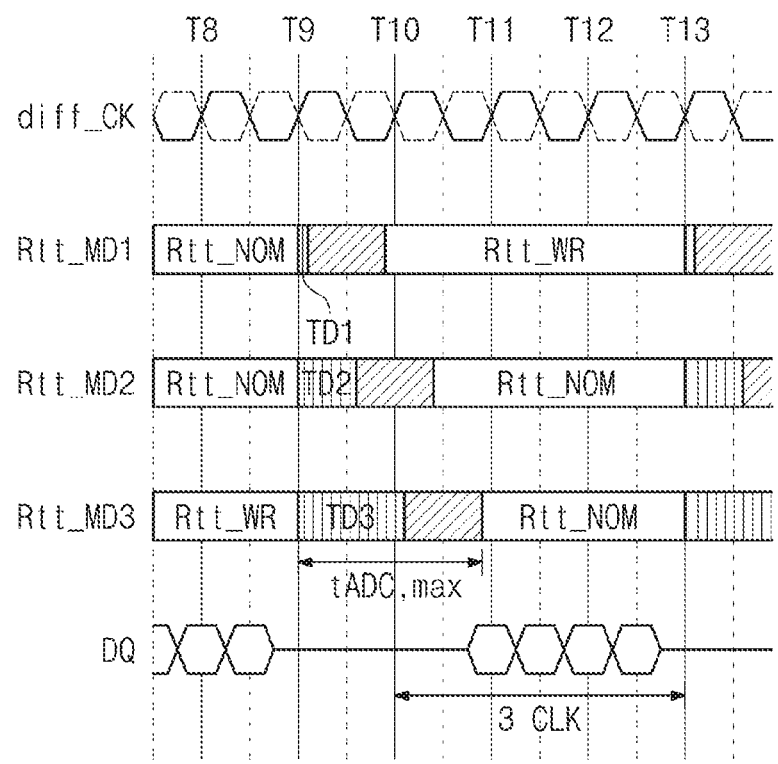
FIG. 11 is a timing diagram illustrating an ODT operation of the memory system of FIG. 1.

FIG. 11 is a timing diagram illustrating an ODT operation of the memory system of FIG. 1. FIG. 11 will be described with reference to FIG. 1.

From T8 to T9, the ODT of each of the first and second memory devices 210 and 310 (operation modes Rtt_MD1 and Rtt_MD2) operates in the Rtt_NOM mode and the ODT of the third memory device 320 (operation mode Rtt_MD3) operates in the Rtt_WR mode. From T9 to T10, by the controller 100, the ODT of the first memory device 210 is changed to the Rtt_WR mode, the ODT of the second memory device 310 maintains the Rtt_NOM mode, and the ODT of the third memory device 320 is changed to the Rtt_NOM mode.

The ODT of the first memory device 210 completes a change to the Rtt_WR mode after the first delay TD1 and before T10. After that, the ODT of the first memory device 210 operates in the Rtt_WR mode during the ODT duration of '3 CLK' from T10. The ODT of the second memory device 310 enters the Rtt_NOM mode after the second delay TD2 and before T11. The ODT of the third memory device 320 completes a change to the Rtt_NOM mode after the third delay TD3 and after the ODT of the second memory device 310 begins operating in the Rtt_NOM mode again. For example, as illustrated in FIG. 11, the ODT of the third memory device 320 completes the change to the Rtt_NOM mode just prior to T11.

From T10 to T13, the first memory device 210 may receive four pieces of data DQ. For example, the first memory device 210 may receive the four pieces of data DQ based on a rising edge and a falling edge of the clock signal during a period within T10 to T13. In this case, since the ODT of the third memory device 320 cannot complete an ODT mode change before the first memory device 210 begins to receive the data DQ (e.g., the leftmost piece of data DQ near T11 in FIG. 11), an SI characteristic of the data signal may be degraded.

Here, the ODT duration when the first memory device 210 performs a write operation is illustrated as '3 CLK'. However, this is only illustrative and is not to limit the inventive concept.

Figure 12:
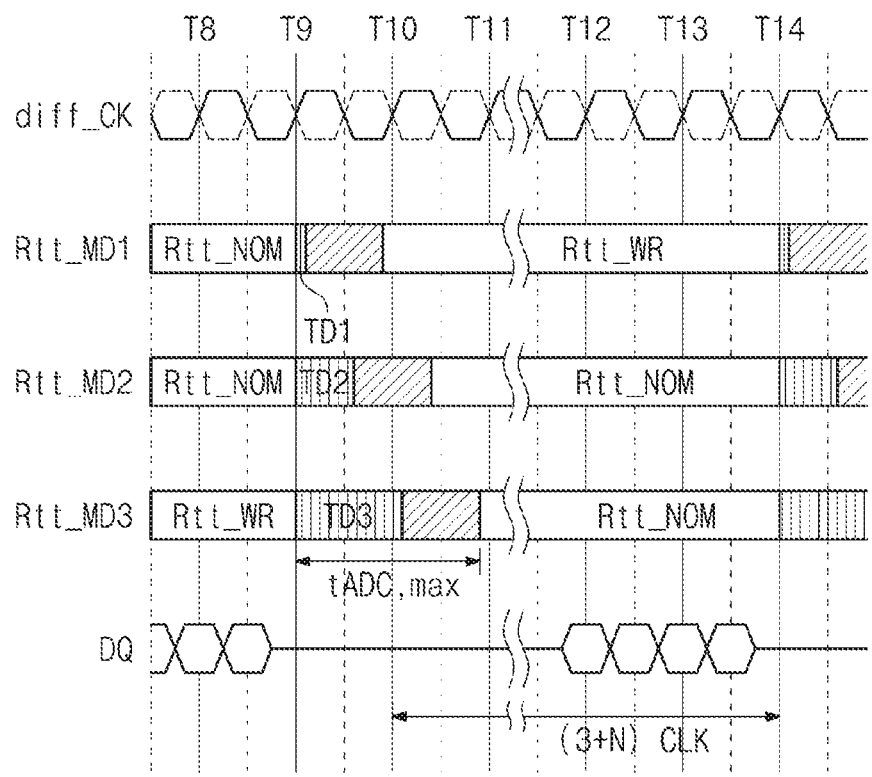
FIG. 12 is a timing diagram illustrating an ODT operation when the memory system of FIG. 1 performs the ODT control method of FIG. 8 according to an exemplary embodiment of the inventive concept.

FIG. 12 is a timing diagram illustrating an ODT operation when the memory system of FIG. 1 performs the ODT control method of FIG. 8 according to an exemplary embodiment of the inventive concept. Since operations from T8 to T10 are substantially the same as that of FIG. 11, a description thereof is omitted.

Similar to FIG. 11, the first memory device 210 completes a change operation to the Rtt_WR mode before T10. After that, the ODT of the first memory device 210 (operation mode Rtt_MD1) operates in the Rtt_WR mode. After the second delay TD2 but before T11, the ODT of the second memory device 310 enters the Rtt_NOM mode, and operates during the ODT duration of '(3+N) CLK' starting from T10. After the third delay TD3, the ODT of the third memory device 320 completes a change operation to the Rtt_NOM mode after the ODT of the second memory device 310 begins operating in the Rtt_NOM mode again.

From T10 to T13, the first memory device 210 may receive four pieces of data DQ. As compared with FIG. 11, the memory system 10 controls an operation of the first through third memory devices 210, 310, and 320 based on the ODT duration of '(3+N) CLK'.

Unlike FIG. 11, the ODT duration further includes a margin of 'N CLK' between T11 to T12. Thus, the ODT mode change of the third memory device 320 is completed before T12, and the first memory device 210 may receive the four pieces of data DQ based on the rising edge and the falling edge of the clock signal between T12 to T14. Consequently, quality (e.g., SI characteristic) degradation of the data due to a margin shortage of the ODT duration may not occur.

Figure 13:
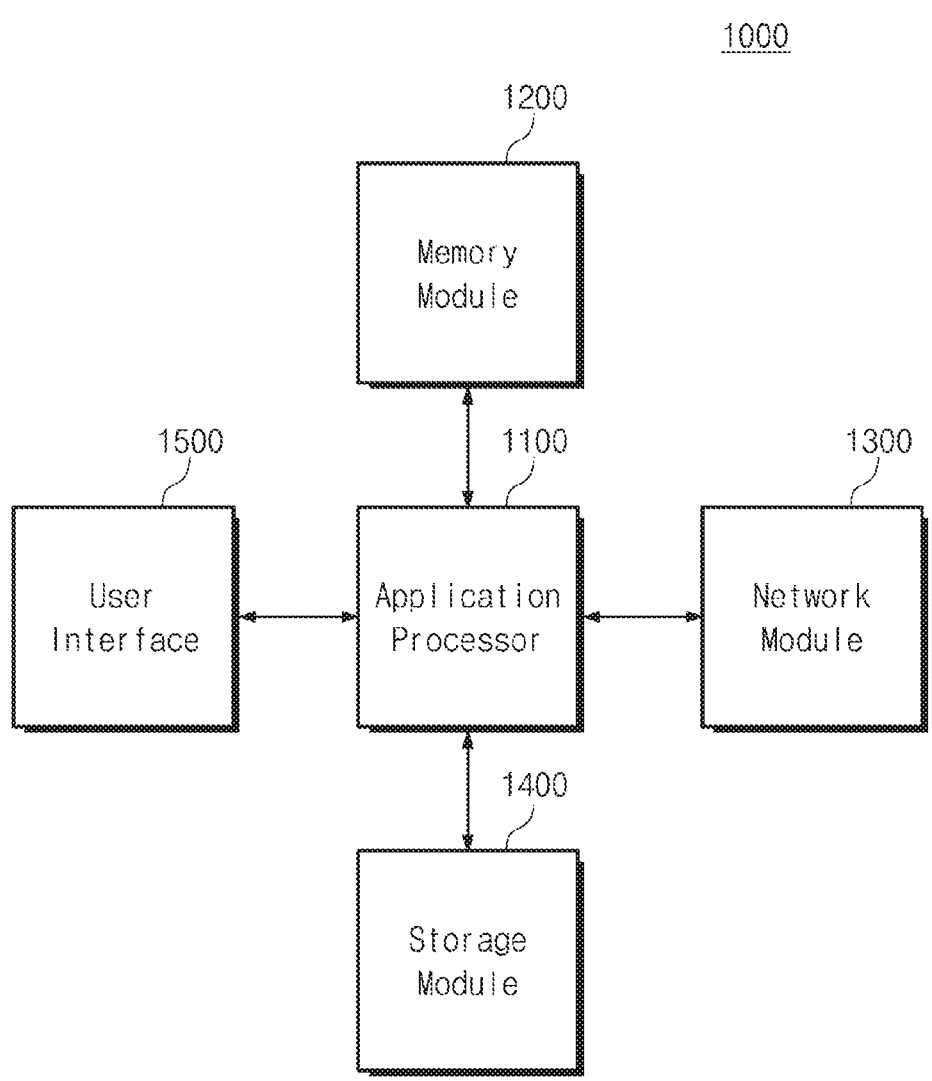
FIG. 13 is a block diagram illustrating a user system including a memory system according to an exemplary embodiment of the inventive concept.

FIG. 13 is a block diagram illustrating a user system including a memory system according to an exemplary embodiment of the inventive concept. Referring to FIG. 13, a user system 1000 may include an application processor 1100, a memory module 1200, a network module 1300, a storage module 1400, and a user interface 1500.

The application processor 1100 can drive constituent elements and an operating system (OS) included in the user system 1000. The application processor 1100 may include controllers that control the constituent elements included in the user system 1000, as well as interfaces, a graphic engine, etc. The application processor 1100 may be provided as a system-on-chip (SoC).

The memory module 1200 may operate as a main, operation, buffer, or cache memory of the user system 1000. The memory module 1200 may include a volatile random access memory such as DRAM, SDRAM, double data rate SDRAM (DDR SDRAM), DDR2 SDRAM, DDR3 SDRAM, low power DDR SDRAM (LPDDR SDRAM), LPDDR2 SDRAM, LPDDR3 SDRAM, etc. or a nonvolatile random access memory such as PRAM, RRAM, MRAM, FeRAM, etc.

The memory module 1200 may be included in the application processor 1100 and may correspond to the memory system 10 described with reference to FIGS. 1 through 12.

The network module 1300 may perform a communication with external devices. For example, the network module 1300 may support a wireless communication such as CDMA, GSM, wideband CDMA (WCDMA), CDMA-2000, time division multiple access (TDMA), LTE, WiMax, wireless local area network (WLAN), ultra-wideband (UWB), Bluetooth, wireless display (WiDi), etc. The network module 1300 may be included in the application processor 1100.

The storage module 1400 may store data. For example, the storage module 1400 may store data received from the application processor 1100. The storage module 1400 can transmit data stored therein to the application processor 1100. The storage module 1400 can be embodied by a nonvolatile semiconductor memory device such as a PRAM, an MRAM, an RRAM, a NAND flash, a NOR flash, a three-dimensional NAND flash, etc.

The user interface 1500 may include interfaces that input data or a command into the application processor 1100 or output data to an external device. For example, the user interface 1500 may include user input interfaces such as a keyboard, a keypad, a button, a touch panel, a touch screen, a touch pad, a touch ball, a camera, a mike, a gyroscope sensor, a vibration sensor, a piezoelectric sensor, etc. The user interface 1500 may include user output interfaces such as a liquid crystal display (LCD), an organic light emitting diode (OLED) display, an active matrix OLED (AMOLED) display, an LED, a speaker, a motor, etc.

As described above, according to exemplary embodiments of the inventive concept, the margin of an ODT parameter may be increased. Accordingly, an SI characteristic of a data signal and data transmission quality may be enhanced.

While the inventive concept has been shown and described with reference to exemplary embodiments thereof, it will be apparent to those of ordinary skill in the art that various substitutions, modifications, and changes may be made thereto without departing from the scope and spirit of the present inventive concept as defined by the following claims.

What is claimed is:

1. A memory system comprising:
   a first dual in-line memory module (DIMM) including a first memory device including a first on-die termination (ODT) circuit for impedance matching with a data line;
   a second DIMM including a second memory device including a second ODT circuit for impedance matching with the data line; and
   a controller configured to be connected to the first and second memory devices through the data line, to generate first delay information and second delay information, and to determine whether to change an ODT duration of at least one of the first ODT circuit and the second ODT circuit using the first and second delay information,
   wherein the first memory device and the second memory device share the data line,
   the first delay information is indicative of a time taken for a first command/address signal or a first clock signal to reach the first memory device in the first DIMM, and
   the second delay information is indicative of a time taken for a second command/address signal or a second clock signal to reach the second memory device in the second DIMM.

2. The memory system of claim 1, wherein a structure of a rank of the first DIMM is different from a structure of a rank of the second DIMM.

3. The memory system of claim 1, wherein the controller performs a first I/O training for the first memory device and generates the first delay information using a result of the first I/O training, and
   the controller performs a second I/O training for the second memory device and generates the second delay information using a result of the second I/O training.

4. The memory system of claim 1, wherein the first DIMM includes a first serial presence detect (SPD) for storing length information of a path of the first command/address signal or a path of the first clock signal to the first memory device within the first DIMM, and
   wherein the second DIMM includes a second SPD for storing length information of a path of the second command/address signal or a path of the second clock signal to the second memory device within the second DIMM.

5. The memory system of claim 4, wherein the controller generates the first delay information using the length information stored in the first SPD, and
   the controller generates the second delay information using the length information stored in the second SPD.

6. The memory system of claim 1, wherein the controller calculates a first change time using the first delay information and a second change time using the second delay information, wherein the first change time is a time taken for a termination value of the first ODT circuit to be changed and the second change time is a time taken for a termination value of the second ODT circuit to be changed, and
   the controller determines whether to change the ODT duration using the first and second change time.

7. The memory system of claim 1, wherein the ODT duration includes a time taken for the first ODT circuit or the second ODT circuit to operate while the controller writes data in the first memory device.

8. The memory system of claim 1, wherein changing the ODT duration comprises increasing the ODT duration by a product of N and a period of the first clock signal or the second clock signal, and N is an integer which is not 0.

9. A method of controlling an on-die termination (ODT) of a memory system comprising:
   collecting, at a controller included in the memory system, first delay information of a first memory device included in a first dual in-line memory module (DIMM) of the memory system and second delay information of a second memory device included in a second DIMM of the memory system; and
   calculating, at the controller, a first ODT parameter of a first ODT of the first memory device using the first delay information and a second ODT parameter of a second ODT of the second memory device using the second delay information.

10. The method of claim 9, wherein a structure of a rank of the first DIMM is different from a structure of a rank of the second DIMM.

11. The method of claim 9, wherein collecting the first and second delay information comprises:
   performing, at the controller, a first I/O training for the first memory device and a second I/O training for the second memory device; and
   generating, at the controller, the first delay information using a result of the first I/O training and the second delay information using a result of the second I/O training.

12. The method of claim 9, wherein collecting the first and second delay information comprises:
   reading, at the controller, length information from a first serial presence detect (SPD) included in the first DIMM and length information from a second SPD included in the second DIMM; and
   generating, at the controller, the first delay information using the length information stored in the first SPD and the second delay information using the length information stored in the second SPD,
   wherein the length information stored in the first SPD is length information of a first command/address signal path or a first clock signal path to the first memory device within the first DIMM, and
   the length information stored in the second SPD is length information of a second command/address signal path or a second clock signal path to the second memory device within the second DIMM.

13. The method of claim 9, wherein the first ODT parameter comprises a first change time of the first ODT and the second ODT parameter comprises a second change time of the second ODT.

14. The method of claim 9, further comprising:
   determining, at the controller, whether at least one parameter of the first ODT parameter and the second ODT parameter is greater than a reference value; and
   increasing, at the controller, ODT duration of the first and second ODT when the at least one parameter is greater than the reference value.

15. The method of claim 14, wherein increasing the ODT duration of the first and second ODT comprises increasing the ODT duration by a product of N and a period of a clock signal used in the memory system, and N is an integer which is not 0.

\* \* \* \* \*